US006919602B2

(12) United States Patent
Lin et al.

(10) Patent No.: US 6,919,602 B2
(45) Date of Patent: Jul. 19, 2005

(54) GATE-COUPLED MOSFET ESD PROTECTION CIRCUIT

(75) Inventors: Shi-Tron Lin, Taipei (TW); Wei-Fan Chen, Taichung (TW)

(73) Assignee: Winbond Electronics Corp., Hsinchu (TW)

(*) Notice: Subject to any disclaimer, the term of this patent is extended or adjusted under 35 U.S.C. 154(b) by 90 days.

(21) Appl. No.: 10/320,201

(22) Filed: Dec. 16, 2002

(65) Prior Publication Data

US 2003/0201457 A1 Oct. 30, 2003

(30) Foreign Application Priority Data

Apr. 30, 2002 (TW) ........................................ 91109035 A

(51) Int. Cl.[7] .............................. H01L 23/62; H02H 9/00
(52) U.S. Cl. ...................... 257/360; 257/355; 257/363; 257/365; 361/56; 361/91; 361/111; 361/117
(58) Field of Search ................................ 257/355–357, 257/360, 363, 365; 361/56, 91, 111, 117, 118, 127; 327/318–321; 323/270

(56) References Cited

U.S. PATENT DOCUMENTS 5,508,649 A * 4/1996 Shay ........................... 327/318
5,978,192 A * 11/1999 Young et al. ................. 361/56

* cited by examiner

*Primary Examiner*—Donghee Kang
(74) *Attorney, Agent, or Firm*—Birch, Stewart, Kolasch & Birch, LLP

(57) ABSTRACT

A gate-coupled MOSFET ESD protection circuit. The circuit has a gate-node potential controlled by an inverter and a timing control circuit. Unlike current-shunting ESD clamping devices that turn the MOSFET fully on during an ESD event, a pull-down element is included to form a voltage divider like circuit, such that the gate-node potential is limited to around 1 to 2 volts during a positive ESD transient event. Unlike GCNMOS (Gate-Coupled NMOS), the invention has better control of the transient gate potential for more effective triggering of the NMOS into snapback during an ESD event.

20 Claims, 5 Drawing Sheets

GATE-COUPLED MOSFET ESD PROTECTION CIRCUIT

Pursuant to 35 U.S.C. § 119(a)–(d), this application claims priority from Taiwanese application no. 91109035, filed on April 30,2002.

BACKGROUND OF THE INVENTION

1. Field of the Invention

The present invention relates to an ESD protection circuit and particularly to a gate-coupled MOSFET ESD protection circuit.

2. Description of the Prior Art

In a Human-Body-Model ESD transient, a 100PF capacitor is first charged up to an ESD pulse voltage, and then discharged through a 1.5-kohm resistor onto an IC pin. Typically, a pulse voltage level of 2 KV is used to qualify an IC package. The initial peak current is roughly 1.2 A with a rise time of approximately 10 nsec. For integrated circuit packages, the VDD-to-VSS capacitance is typically larger than 1 NF. If the ESD energy is directly absorbed by the power bus (for ESD stress of VDD pin to VSS pin), or indirectly absorbed by the power bus (for example, positive ESD stress on an input or I/O pin that has a pull up device such as p+/n well or PMOSFET), then the voltage-rising rate inside an IC can reach 1 to 2 volt per nano-second for a Human-Body-Model ESD pulse at 2 to 3 KV level.

Transistors, such as grounded-gate NMOS (GGNMOS), field-oxide device, or output buffer transistors, have been commonly used as primary ESD protection elements for integrated circuits.

For ESD protection of an IC pin or a power bus, GGN-MOS can be used as the primary ESD protection. The drain of the NMOS transistor is connected to VDD or the IC pin, while the source of the NMOS transistor is connected to VSS. The gate is either grounded (GGNMOS), or coupled to VDD by a capacitor and to VSS by a resistor (GCNMOS or Gate-Coupled NMOS).

ESD Voltage Clamping Device

One well known ESD protection circuit involves the use of a transistor controlled by a resistance-capacitance (RC) circuit for shunting the flow of ESD current between the protected bond pad and a power supply pad (e.g., VSS).

FIG. 1 shows a conventional RC-triggered active MOSFET ESD clamp circuit. The clamp circuit provides a current shunt to protect internal circuit for a VDD-to-VSS positive voltage ESD event. The inverter 11 composed of the transistors N1 and P1 inverts a voltage on a node E to an output voltage on a node G, which keeps the transistor N1 conductive for a period of time as determined by the RC time constant (R1C1). It is critical that this RC time constant is long enough to exceed the maximum expected duration of an ESD event, typically in the range of 50 nanoseconds to a few hundred nanoseconds, while short enough to avoid false triggering of the clamp circuit during normal ramp-up of the VDD power bus, typically a few milliseconds. During normal operation of the IC, with a constant VDD power supply level, the transistor N1 is biased in a nonconductive state due to the resistor R1 pulling node E at High and node G at Low.

The described voltage-clamping ESD protection device can be used to protect between VDD and VSS power supply rails. However, certain concerns are that (i) the device size is typically very large, e.g., with a number of power-bus-clamp NMOSFETs having a total channel width of 4000 to 10,000 m; and (ii) the inverter 11 amplifies the power-bus noise through the node E, causing undesirable leakage current at N2 during circuit operation.

ESD Protection by Avalanche Breakdown

Another well-known ESD protection method is based on the avalanche breakdown and snapback of a MOSFET device. At the beginning, the high electric field at the drain junction causes impact ionization with generation of both minority and majority carriers. The minority carriers are collected at the drain (anode), while the majority carriers flow toward the substrate or p-well contact (cathode) causing a local potential buildup in the p-well. When the local substrate potential is 0.8V higher than the adjacent n+ source potential, the source junction becomes forward biased. The forward biased source junction injects minority carriers into the p-well. Some of those injected minority carriers are recombined in the substrate while the rest of them reach the drain junction to further enhance the impact ionization. As a continuous loop, the MOSFET enters a low impedance (snapback) state to conduct large amounts of ESD current.

It is of great advantage to reduce the triggering voltage of a MOSFET during an ESD event. The ESD protection can occur sooner, and the transient voltage imposed on the I/O and internal circuit can be lower, for better overall ESD protection.

FIG. 2 shows a conventional gate-coupled ESD protection circuit. The RC time constant is chosen such that the node G is at about 1 to 2 volts (or around 0.7V to 2V) during an ESD transient for reducing ESD triggering voltage for avalanche breakdown and snapback.

For GGNMOS or GCNMOS, because the conduction of ESD current is through the drain/substrate/source (npn) bipolar junction, it can conduct a large ESD current with a smaller MOSFET when compared to a voltage clamping ESD protection device, and for power bus ESD protection, typically one with a total channel width of, for example, 600 to 1200 m may provide sufficient ESD protection.

However, for a GCNMOS, the selection of the RC time constant for optimized ESD triggering duration and the transient voltage on the node G for different ESD pulse levels may sometimes impose some difficulty.

SUMMARY OF THE INVENTION

The object of the present invention is to provide an ESD protection circuit using an improved gate-coupled MOSFET having a stable transient gate-node voltage when the ESD event occurs.

The present invention provides a gate-coupled MOSFET ESD protection circuit providing an ESD path from a first to a second node when an ESD voltage applied to the first node. The circuit comprises a timing-control circuit outputting a first voltage when the ESD voltage is applied to the first node, a voltage divider outputting a second voltage divided from the ESD voltage when activated by the first voltage output from the timing-control circuit, and a shunt transistor having a drain coupled to the first node, a source coupled to the second node and a gate-coupled to the voltage divider, and entering into a snapback to provide the ESD path by the drain and gate receiving the ESD and second voltage when the ESD voltage is applied to the first node.

The present invention further provides a gate-coupled MOSFET ESD protection circuit providing an ESD path from a first to a second power bus when an ESD voltage applied to the first power bus. The circuit comprises a timing-control circuit outputting a first voltage when the ESD voltage is applied to the first power bus, a voltage divider outputting a second voltage divided from the ESD voltage when activated by the first voltage output from the timing-control circuit, and a shunt transistor having a drain coupled to the first power bus, a source coupled to the second power bus and a gate-coupled to the voltage divider, and entering into a snapback to provide the ESD path by the drain and gate receiving the ESD and the second voltage when the ESD voltage is applied to the first power bus.

The present invention also provides a gate-coupled MOSFET ESD protection circuit providing an ESD path from a pad to a second power bus when an ESD voltage is applied to the pad, the ESD voltage is coupled through a PN junction to a first power bus. The circuit comprises a timing-control circuit outputting a first voltage when the ESD voltage is applied to the pad, a voltage divider outputting a second voltage divided from the ESD voltage when activated by the first voltage output from the timing-control circuit, and a shunt transistor having a drain coupled to the pad, a source coupled to the second power bus and a gate-coupled to the voltage divider, and entering into a snapback to provide the ESD path by the drain and gate receiving the ESD and second voltage when the ESD voltage is applied to the pad.

The present invention provides a gate-coupled MOSFET ESD protection circuit providing an ESD path to a second node when an ESD voltage applied to one of first nodes. The circuit comprises a timing-control circuit outputting a first voltage when the ESD voltage is applied to one of the first nodes; a voltage divider outputting a second voltage divided from the ESD voltage when activated by the first voltage output from the timing-control circuit, and a shunt transistor having a drain coupled to the first nodes, a source coupled to the second power bus and a gate-coupled to the voltage divider, and entering into a snapback to provide the ESD path by the drain and gate receiving the ESD and second voltage when the ESD voltage is applied to one of the first nodes.

Thus, in the present invention, the device size is smaller than that of the conventional voltage-clamping ESD protection circuit and the gate-node voltage is more easily controlled than that of the conventional gate-coupled ESD protection circuit.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
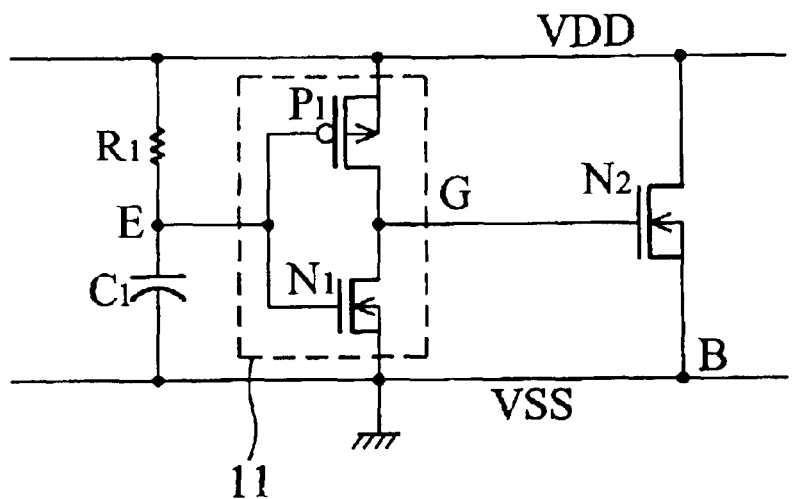
FIG. 1 shows a conventional RC-controlled active MOSFET ESD clamp circuit.
Figure 2:
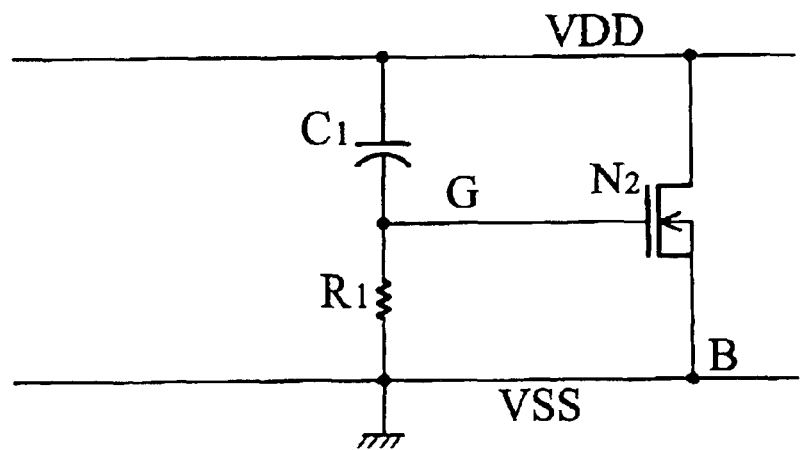
FIG. 2 shows a conventional gate-coupled ESD protection circuit.
Figure 3:
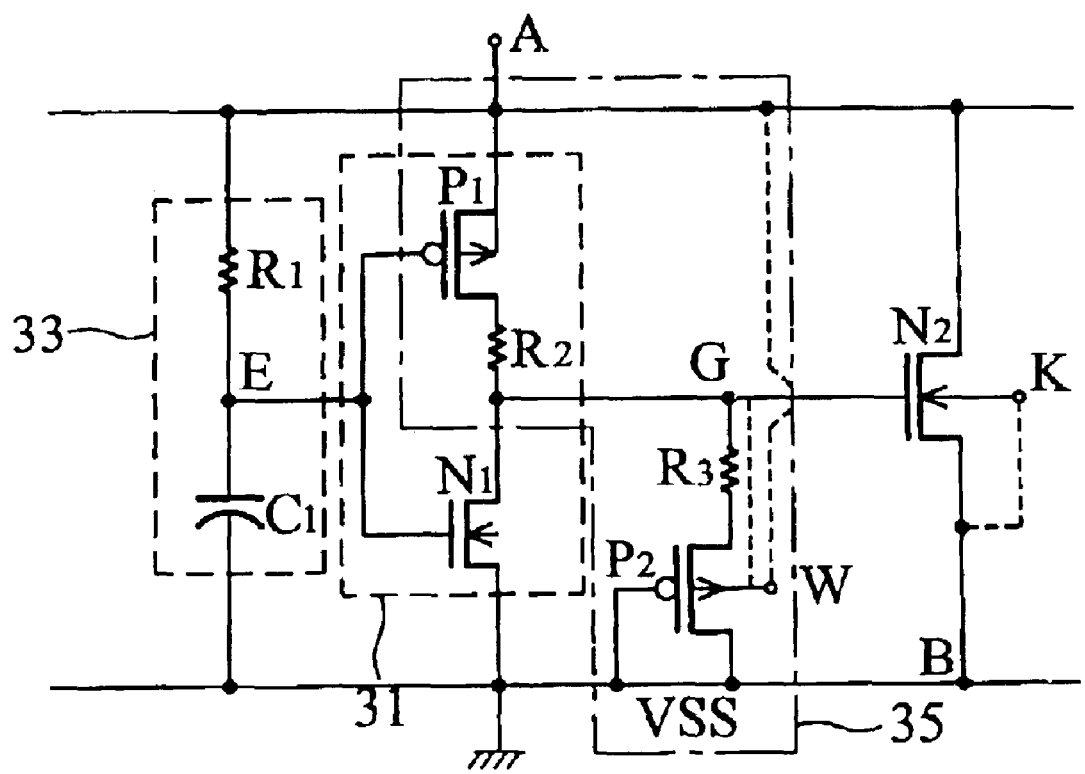
FIG. 3 is a diagram showing an ESD protection circuit according to a first embodiment of the invention.

FIG. 3 is a diagram showing an ESD protection circuit according to a first embodiment of the invention. A gate-coupled MOSFET ESD protection circuit provides an ESD path from a node A to node B when an ESD pulse voltage applied to the node A. The circuit comprises a timing-control circuit 33 composed of a resistor R1 and a capacitor C1, a voltage divider 35 composed of transistors P1 and P2 and resistors R2 and R3, and a N type shunt transistor N2. The timing-control circuit 33 outputs a low voltage at the node E when the ESD pulse voltage is applied to the node A. The voltage divider 35 outputs a voltage divided from the ESD voltage at the node G when activated by the low voltage output from the timing-control circuit 33. The shunt transistor N2 has a drain coupled to the node A, a source coupled to the node B and a gate coupled to the voltage divider 35, and enters into a snapback to provide the ESD path by the drain and gate receiving the ESD and the voltage at node G when the ESD voltage is applied to the node A. A triggering voltage for the shunt transistor N2 to enter into the snapback is reduced since the shunt transistor N2 is weakly turned on by the gate receiving a voltage at the node G from the voltage divider 35 when the ESD voltage is applied to the node A. In the voltage divider 35, the P type transistor P1 has a gate receiving the low voltage output from the timing-control circuit 33, a source coupled to the node A, and a drain coupled and outputting the voltage at the node G to the gate of the shunt transistor N2. The P type transistor P2 has a gate and drain commonly coupled to the node B, and a source coupled to the gate of the shunt transistor N2. The N type transistor N1 and P type transistor P1 also form an inverter 31.

During the initial phase of a positive ESD event, as the voltage at the node E increases, the voltage at the node E stays at low, both of the transistors P1 and P2 turn on, and the voltage at the node G is determined by the on-resistance ratio of the transistors P1 and P2. By adjusting the W/L size ratio, considering the body effect of the transistors P1 and P2 and the approximate triggering voltage of the transistor N2, one can keep the voltage at the node G in the desirable range of 1-to-2 volt when the voltage at node E increases to approximately the triggering voltage level of the transistor N2.

The n-well-node W of the transistor P2 can be coupled to the node G, or to the node A, with different body effect for the transistor P1 and P2 W/L size considerations.

The p-well-node K of the transistor N2 can be coupled to the node B, or to the node G. If The p-well-node K of the transistor N2 is coupled to the node G, the source junction of the transistor N2 is forward biased to facilitate the triggering of the transistor N2 into the snapback during an ESD event.

The R1C1 time constant provides sufficient time for NMOS triggering. R1C1 can be, as an example, 15 to 50 nanoseconds.

The resistances R2 and R3 can be simply the metal wiring resistance. Alternatively, the resistances R2 and R3 can be resistor elements (such as those formed by polysilicon or n-well) for limiting ESD current flow through the transistors P1 and P2 during an ESD event. The voltage divider circuit formed by the transistors P1 and P2, and resistors R2 and R3, thus have a voltage dividing ratio of $$V_G/V_A=[R_{ON}(P2)+R3]/[R_{ON}(P1)+R2+R_{ON}(P2)+R3]$$

in a steady state. Of course, during ESD transient, the electrical charging of the gate capacitance of the transistor N2 will play a role in the transient response. Those skilled in the art will appreciate that the desirable resistances R2 and R3, and sizes of the transistors P1 and P2, can be obtained by circuit simulation based on the ESD transient waveform.

For node A as a VDD power bus node, the transistor N1 turns on(pulled high through the resistor R1) during powering on and normal circuit operation to keep the transistor N2 in an off state.

During circuit operation, even if there is noise at the node E(through ground bounce or power supply noise), the voltage at the node G is limited for suppressing leakage current of the transistor N2.

Figure 4A:
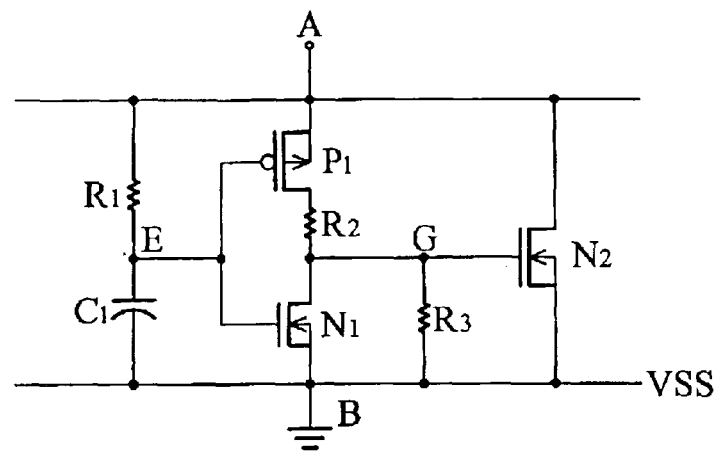
FIG. 4A is a diagram showing an ESD protection circuit according to a second embodiment of the invention.

FIG. 4A is a diagram showing an ESD protection circuit according to a second embodiment of the invention. This is an alternative circuit modified from the one shown in FIG. 3. The transistor P2 is replaced by the resistor R3 and the transistor N1 is removed. The voltage dividing ratio is $$V_G/V_A=R3/[R_{ON}(P1)+R2+R3]$$

which is preferably from 1/15 to 3/5 so that the gate voltage of the transistor N2 can range from 1 to 2 volts, 0.5 to 2.5 volts or 0.5V to half of the voltage at the node A.

Figure 4B:
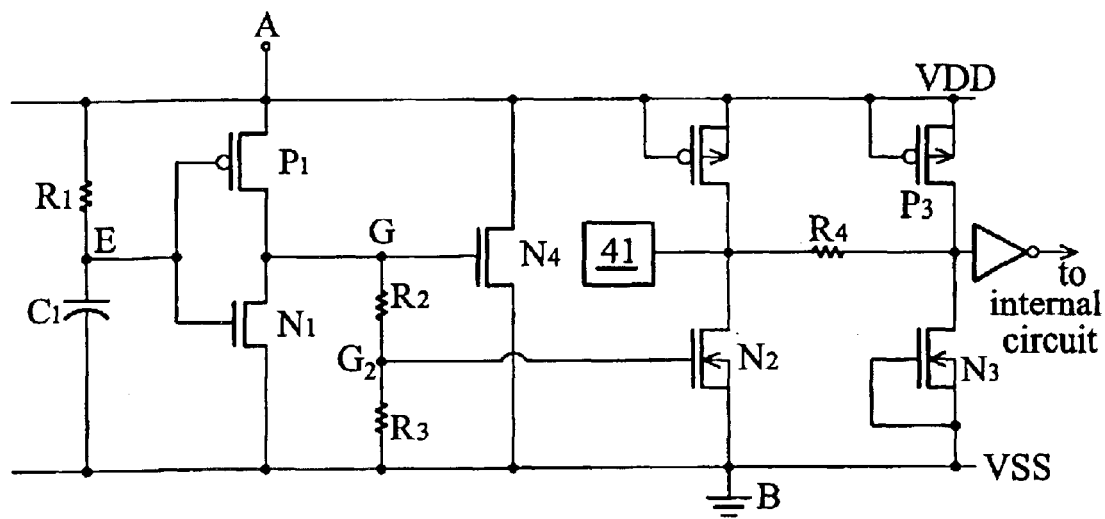
FIG. 4B is a diagram showing an ESD protection circuit according to a third embodiment of the invention.

FIG. 4B is a diagram showing an ESD protection circuit according to a third embodiment of the invention. This is an ESD protection circuit providing ESD paths from more than one node (IC pins or power bus) to the VSS power bus. When the ESD event occurs, the transistor N2 provides an ESD path from the pad to the VSS power bus by entering into the snapback while the transistor N4 provides an ESD path from the VDD to the VSS power bus by being turned on.

When a positive ESD event occurs on the VDD power bus, the ESD pulse voltage is divided by the voltage divider with a voltage-dividing ratio of $V_{G1}/V_A=[R2+R3]/[R_{ON}(P1)+R2+R3]$, received by the gate of the transistor N4 and directly turns on the transistor N4. When a positive ESD event occurs on the pad, the ESD pulse voltage is coupled to the VDD power bus, which turns on the transistor N4 and applies a voltage divided from the ESDF pulse voltage with a ratio of $V_{G2}/V_A=[R3]/[R_{ON}(P1)+R2+R3]$. This reduces the triggering voltage of the transistor N2. The transistor N2 enters into the snapback earlier with the lower triggering voltage. The ratio of the resistance R3 to R2 is preferably the range of 1/12 to 2.5/5, or 1.5/7 to 2.5/5.

Alternatively, the resistance R2 can be relatively low such that the node G1 and G2 are substantially shorted. This results in the voltages on the gates of the transistors N2 and N4 being the same. In this case, both of the transistors N2 and N4 provide the ESD paths by entering into the snapback.

Figure 5:
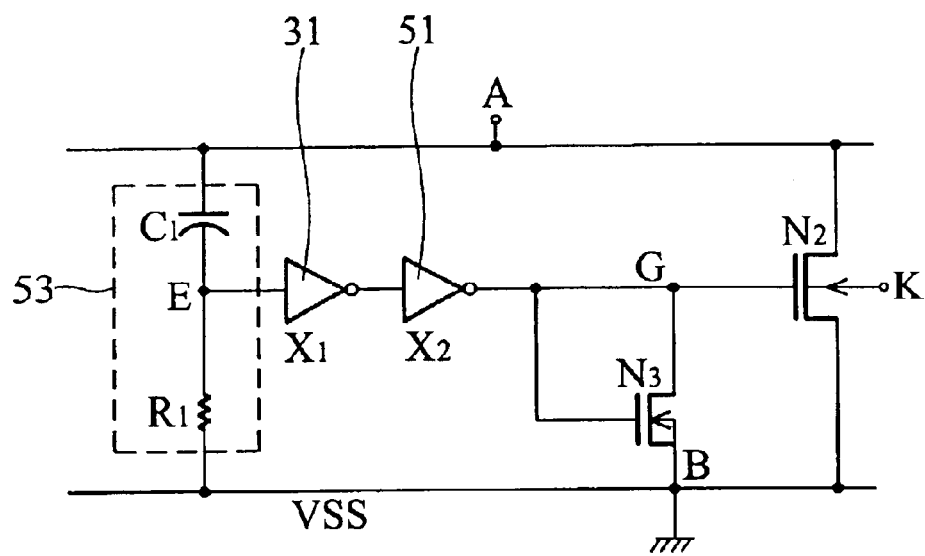
FIG. 5 is a diagram showing an ESD protection circuit according to a fourth embodiment of the invention.

FIG. 5 is a diagram showing an ESD protection circuit according to a fourth embodiment of the invention. This is an alternative circuit modified from the one shown in FIG. 4B. By comparing the circuits shown in FIGS. 3 and 5, it is noted that the resistor R1 and capacitor C1 are interchanged, the P type transistor P2 is replaced by the N type transistor N3, the gate of the transistor N3 is coupled to the node G, and the inverter 51 is added between the inverter 31 and the node G.

The voltage divider here is composed of two inverters 31 and 51 connected in series, and the N type transistor N3. The inverter 31 has an input receiving the voltage output from the timing-control circuit 53 at node E and an output coupled to the gate of the shunt transistor N2. The transistor N3 has a source coupled to the node B, and a drain and a gate commonly coupled and outputting the divided ESD voltage to the gate of the shunt transistor N2. During the initial phase of a positive ESD event, as the voltage at the node A increases, the voltage at the node E follows the node A voltage due to the capacitor C1. Coupling to the node E by inverters 31 and 51, the voltage at the node G also increases by the pull-up element of the inverter 51. But the voltage at the node G cannot be pulled high close to the voltage at the node A because the transistor N3 starts to conduct when the voltage at the node G is higher than a threshold voltage of the transistor N3. As a result, by adjusting the size (W/L) ratio of the transistor N3 and the pull-up element of the inverter 51, the voltage at the node G can be around 1-to-2 volts when the voltage at the node A increases to about the triggering voltage (e.g. 8V to 12V) of the transistor N2. The actual device sizes can be selected based on circuit simulation of a Human-Body-ESD event.

The p-well (the node K) of the transistor N2 can be coupled to the node B (as a typical case for p-substrate). Alternatively, the node K can be coupled to the node G, or as a floating node, for n-substrate/p-well process technology.

Figure 6:
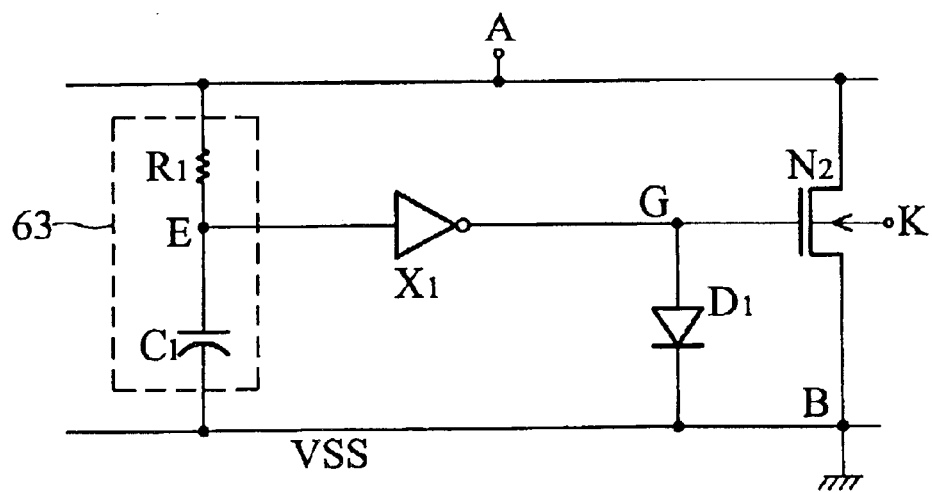
FIG. 6 is a diagram showing an ESD protection circuit according to a fifth embodiment of the invention.

FIG. 6 is a diagram showing an ESD protection circuit according to a fifth embodiment of the invention. This is an alternative circuit modified from the one shown in FIG. 5. By comparing the circuits shown in FIGS. 5 and 6, it is noted that the resistor R1 and capacitor C1 are interchanged, the N type transistor N3 is replaced by a diode D1 and the inverter 51 is removed.

The diode D1 functions similarly to the transistor N3 in FIG. 5. The voltage divider here is composed of the inverter 31 and the diode D1. The inverter 31 has an input receiving the voltage output from the timing-control circuit 63 at the node E and an output coupled to the gate of the shunt transistor N2. The diode D1 has a cathode coupled to the node B and an anode coupled and outputting the divided ESD voltage to the gate of the shunt transistor N2. During the initial phase of a positive ESD event, as the voltage at the node A increases, the voltage at the node E stays close to VSS due to the capacitor C1. Through the inverter 31, the voltage at the node G increases by the pull-up element of the inverter 31. But the voltage at the node G cannot be pulled high close to the voltage at the node A because the diode D1 starts to conduct when the voltage at the node G is higher than the turn-on voltage of the diode D1. As a result, by adjusting the size (W/L) of the diode D1 and the pull-up element of the inverter 31, the voltage at the node G can be around 1-to-2 volts when the voltage at the node A increases to about the triggering voltage of the transistor N2. The actual device sizes can be selected based on circuit simulation of a Human-Body-ESD event.

Additionally, the diode D1 may be replaced by a resistor.

Figure 7:
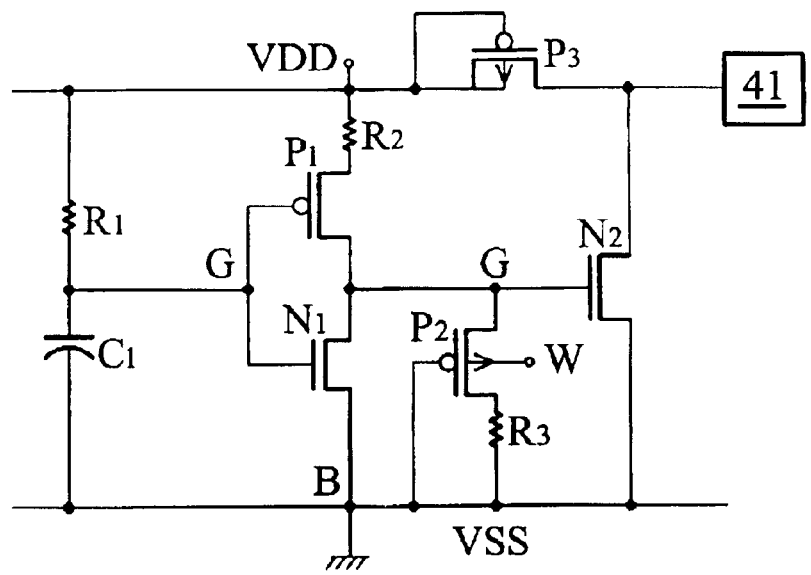
FIG. 7 is a diagram showing an ESD protection circuit according to a sixth embodiment of the invention.

FIG. 7 is a diagram showing an ESD protection circuit according to a sixth embodiment of the invention. This is an alternative circuit modified from the one shown in FIG. 6, which provides an ESD path from the pad to the VSS power bus.

The resistor R1 and the transistor P1 are coupled to the VDD power bus, and the transistor N2 is coupled to the pad. A P type MOSFET P3 is coupled between the pad and the VDD power bus.

During a positive ESD event occurring between the IC pad and the VSS power bus, the positive ESD voltage is coupled to the VDD power bus through forward biasing a parasitic p+/n-well junction diode of the MOSFET P3.

Figure 8:
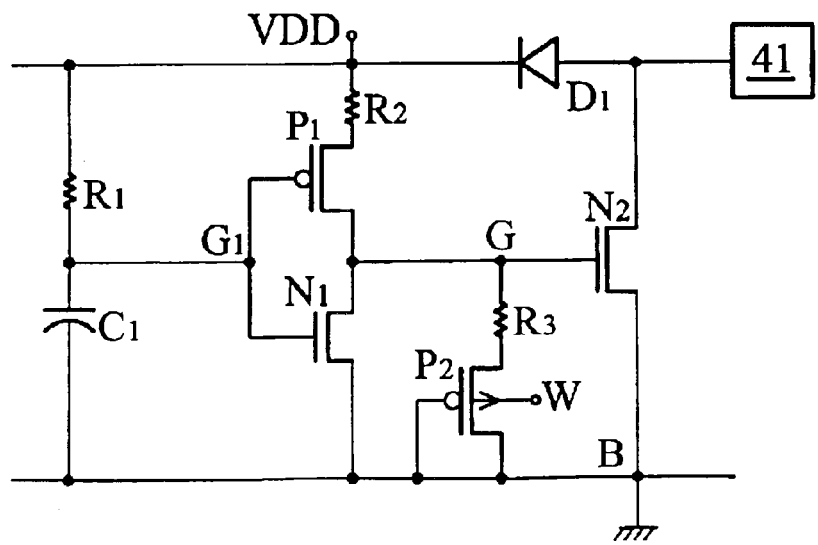
FIG. 8 is a diagram showing an ESD protection circuit according to a seventh embodiment of the invention.

The MOSFET P3 cab be replaced by a diode, as shown in FIG. 8 and optimally, a resistor R3 can be instead connected in series with the PMOS transistor P2, and become part of the voltage dividing circuit during an ESD event.

In conclusion, the present invention provides an ESD protection circuit using an improved gate-coupled MOSFET having a stable transient gate-node voltage when the ESD event occurs. The device size is smaller than that of the conventional voltage-clamping ESD protection circuit and the gate-node voltage is more easily controlled than that of the conventional gate-coupled ESD protection circuit.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD protection circuit providing an ESD path from a first to a second node when an ESD voltage applied to the first node, the circuit comprising:
   a timing-control circuit outputting a first voltage when the ESD voltage is applied to the first node;
   a voltage divider outputting a second voltage divided from the ESD voltage when activated by the first voltage output from the timing-control circuit, wherein the voltage divider comprises:
   an inverter having an input receiving the first voltage output from the timing-control circuit, and an output; and
   a resistor having one end coupled to the second node, and the other end outputting the second voltage; and
   a shunt transistor having a drain coupled to the first node, a source coupled to the second node and a gate coupled to the other end of the resistor and the output of the inverter, and entering into a snapback to provide the ESD path from the drain to the source when the ESD voltage is applied to the first node.

2. The circuit as claimed in claim 1, wherein a triggering voltage for the shunt transistor to enter into the snapback is reduced since the shunt transistor is weakly turned on by the gate receiving the second voltage from the voltage divider when the ESD voltage is applied to the first node.

3. The circuit as claimed in claim 1, wherein the second voltage output from the voltage divider when the ESD voltage is applied to the first node and the shunt transistor is triggered for entering into snapback ranges from 1V to 2V.

4. The circuit as claimed in claim 1, wherein the second voltage output from the voltage divider when the ESD voltage is applied to the first node and the shunt transistor is triggered for entering into snapback ranges from 0.5V to 2.5V.

5. The circuit as claimed in claim 1, wherein the second voltage output from the voltage divider after the ESD voltage is applied to the first node and the shunt transistor is triggered for entering into the snapback ranges from 0.5V to half of an operating voltage.

6. The circuit as claimed in claim 1, wherein the voltage divider comprises:
   a first transistor having a gate receiving the first voltage output from the timing-control circuit, a source coupled to the first node, and a drain coupled and outputting the second voltage to the gate of the shunt transistor; and
   a second transistor having a gate and drain commonly coupled to the second node, and a source coupled to the gate of the shunt transistor.

7. The circuit as claimed in claim 6, the second transistor having a well coupled to the source.

8. The circuit as claimed in claim 6, the second transistor having a well coupled to the first node.

9. The circuit as claimed in claim 1, wherein the voltage divider comprises:
   a first and second inverter connected in series, an input of the first inverter receiving the first voltage output from the timing-control circuit, and an output of the second inverter coupled to the gate of the shunt transistor; and
   a third transistor having a source coupled to the second node, and a gate and drain coupled and output the second voltage to the gate of the shunt transistor.

10. The circuit as claimed in claim 1, wherein the voltage divider comprises:
    an inverter having an input receiving the first voltage output from the timing-control circuit and an output coupled to the gate of the shunt transistor; and
    a diode having a cathode coupled to the second node, and an anode coupled and output the second voltage to the gate of the shunt transistor.

11. An ESD protection circuit providing an ESD path from a first to a second power bus when an ESD voltage applied to the first power bus, the circuit comprising:
    a timing-control circuit outputting a first voltage when the ESD voltage is applied to the first power bus;
    a voltage divider outputting a second voltage divided from the ESD voltage when activated by the first voltage output from the timing-control circuit, wherein the voltage divider comprises:
    an inverter having an input receiving the first voltage output from the timing-control circuit, and an output; and
    a resistor having one end coupled to the second power bus, and the other end outputting the second voltage; and
    a shunt transistor having a drain coupled to the first power bus, a source coupled to the second power bus and a gate coupled to the other end of the resistor and the output of the inverter, and entering into a snapback to provide the ESD path by the drain and the gate receiving the ESD and the second voltages when the ESD voltage is applied to the first power bus.

12. An ESD protection circuit providing an ESD path to a second node when an ESD voltage applied to one of first nodes, the circuit comprising:
    a timing-control circuit outputting a first voltage when the ESD voltage is applied to one of the first nodes;
    a voltage divider outputting a second voltage divided from the ESD voltage when activated by the first voltage output from the timing-control circuit, wherein the voltage divider comprises:
    an inverter having an input receiving the first voltage output from the timing-control circuit, and an output; and
    a resistor having one end coupled to the second node, and the other end outputting the second voltage; and a shunt transistor having a drain coupled to the first nodes, a source coupled to the second power bus and a gate coupled to the other end of the resistor and the output of the inverter, and entering into a snapback to provide the ESD path when the drain and the gate receiving the ESD and the second voltages and the ESD voltage is applied to one of the first nodes.

13. An ESD protection circuit having a first power bus, a second power bus, and a first transistor coupled between the first power bus and the second power bus, the circuit comprising:

an inverter having an input controlled by a timing circuit and an output coupled to a first gate of the first transistor;

a pad coupled to the first power bus through a pull-up element and coupled to the second power bus through a second transistor, wherein the output of the inverter is further coupled to a second gate of the second transistor for reducing a trigger voltage of the second transistor during an ESD transient.

14. The circuit as claimed in claim 13, wherein the output of the inverter is coupled to the second gate through a first impedance.

15. The circuit as claimed in claim 13, wherein the output of the inverter is coupled to the second power bus through a second impedance.

16. The circuit as claimed in claim 13, wherein the output of the inverter is coupled to the second gate through a first impedance and coupled to the second power bus through a second impedance.

17. The circuit as claimed in claim 13, wherein the output of the inverter is coupled to the second gate through a first impedance and coupled to the second power bus through a serial coupling of a first impedance and a second impedance.

18. The circuit as claimed in claim 13, wherein the output of the inverter is connected to the second gate and coupled to the second power bus through a second impedance.

19. The circuit as claimed in claim 1, wherein the timing circuit comprises a resistor and a capacitor serially coupled between the first power bus and the second power bus.

20. The circuit as claimed in claim 1, wherein the first transistor and the second transistor are of a first type, and the pull-up element is a third transistor of a second type.

* * * * *